United States Patent
Lee et al.

(10) Patent No.: US 6,746,924 B1
(45) Date of Patent: Jun. 8, 2004

(54) METHOD OF FORMING ASYMMETRIC EXTENSION MOSFET USING A DRAIN SIDE SPACER

(75) Inventors: Byoung H. Lee, Wappingers Falls, NY (US); Anda C. Mocuta, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/248,884

(22) Filed: Feb. 27, 2003

(51) Int. Cl.$^7$ .............................. H01L 21/335
(52) U.S. Cl. ................. 438/286; 438/303; 438/595; 438/757
(58) Field of Search ................. 438/286, 303, 438/595, 757, FOR 158, 944, FOR 240

(56) References Cited

U.S. PATENT DOCUMENTS

| | | | |
|---|---|---|---|
| 5,900,666 A | * 5/1999 | Gardner et al. | ............. 257/401 |
| 5,904,529 A | 5/1999 | Gardner et al. | |
| 5,936,277 A | 8/1999 | Takeuchi | |
| 5,960,291 A | 9/1999 | Krivokapic | |
| 5,963,809 A | 10/1999 | Duane et al. | |
| 6,140,186 A | 10/2000 | Lin et al. | |
| 6,168,999 B1 | * 1/2001 | Xiang et al. | ................. 438/286 |
| 6,200,863 B1 | * 3/2001 | Xiang et al. | ................. 438/286 |
| 6,200,864 B1 | 3/2001 | Selcuk | |
| 6,207,516 B1 | * 3/2001 | Tang | ............................ 438/301 |
| 6,406,964 B1 | 6/2002 | Wristers et al. | |
| 6,429,084 B1 | * 8/2002 | Park et al. | ................... 438/305 |

FOREIGN PATENT DOCUMENTS

| | | | | |
|---|---|---|---|---|
| JP | 59188914 A | * 10/1984 | ............ | H01L/21/28 |
| JP | 5-211161 | 8/1993 | | |
| JP | 10-270677 | 10/1998 | | |
| JP | 2000031267 A | * 1/2000 | ............ | H01L/21/76 |
| JP | 2000-216384 | 8/2000 | | |
| WO | WO96/19010 | 6/1996 | | |

* cited by examiner

Primary Examiner—George Fourson
(74) Attorney, Agent, or Firm—Scully, Scott, Murphy & Presser; Joseph P. Abate, Esq.

(57) ABSTRACT

A method of forming an asymmetric extension MOSFET using a drain side spacer which allows a choice of source and drain sides for each individual MOSFET device and also allows an independent design or tuning of the source and drain extension implant dose as well as its spacing from the gate. A photoresist mask is formed over at least a portion of each drain region, followed by an angled ion implant during which the photoresist mask and the gate conductor shield the nitride layer over at least a portion of the drain region and at least one sidewall of the gate conductor from damage by the angled ion implant which selectively damages portions of the nitride layer unprotected by the photoresist mask and the gate conductor. Then damaged portions of the nitride layer are removed while leaving undamaged portions of the nitride layer as a nitride mask to protect at least a portion of each drain region and at least one gate sidewall from a subsequent dopant implant, which is performed into the source regions and the drain regions while using the undamaged portions of the nitride layer as a mask to form the asymmetric extension MOSFET device. In some embodiments the nitride mask can be etched to form drain side spacers to provide different spacings for the source and drain extension ion implants.

13 Claims, 2 Drawing Sheets

METHOD OF FORMING ASYMMETRIC EXTENSION MOSFET USING A DRAIN SIDE SPACER

BACKGROUND OF INVENTION

The present invention relates generally to a method of forming an asymmetric extension MOSFET (metal oxide semiconductor field effect transistor) using a drain side spacer, and more particularly to a method of forming an asymmetric extension MOSFET using a drain side spacer which allows a choice of source and drain sides for each individual MOSFET device and also allows an independent design or tuning of the source and drain extension implant dose as well as its spacing from the gate.

Asymmetric MOSFET devices are known MOSFET devices wherein the source and drain regions are not symmetrically doped because of different implant dosages or because of asymmetric source and drain extension implant relative to the gate channel conductor.

Asymmetric MOSFET devices are known to provide advantages of increased drive currents and reduced parities. Asymmetric extension and halo devices can be fabricated by using angled implants and by using the gate to mask the source or drain region. This prior art method of fabrication does not allow independent definition of the source and drain regions for each device which is critical for efficient circuit design. Also, using angled implants and using thick photoresist shading on the drain or source side is not very desirable for fabricating devices with an asymmetric extension.

SUMMARY OF INVENTION

The present invention provides a method of forming an asymmetric extension MOSFET by using a drain side spacer which allows a choice of source and drain sides for each individual MOSFET device and also allows an independent design or tuning of the source and drain extension implant dose as well as its spacing from the gate.

The method starts with a semiconductor device produced by art known techniques and having a substrate on which gate conductors separate source regions and drain regions, with an oxide layer formed over the gate conductors, the source regions and the drain regions, and a nitride layer formed over the oxide layer. A photoresist mask is formed over at least a portion of each drain region, followed by an angled ion implant during which the photoresist mask and the gate conductor shield the nitride layer over at least a portion of the drain region and on at least one sidewall of the gate conductor from damage by the angled ion implant which selectively damages portions of the nitride layer unprotected by the photoresist mask and the gate conductor. Then damaged portions of the nitride layer are removed while leaving undamaged portions of the nitride layer as a nitride mask to protect at least a portion of each drain region and at least one gate sidewall from a subsequent dopant implant which is performed into the source regions and the drain regions while using the undamaged portions of the nitride layer as a mask to form the asymmetric extension MOSFET device.

The present invention allows a drain region to be defined on either side of the device and provides a spacer on the drain side of the device.

BRIEF DESCRIPTION OF DRAWINGS

The foregoing objects and advantages of the present invention for a method of forming an asymmetric extension MOSFET using a drain side spacer may be more readily understood by one skilled in the art with reference being had to the following detailed description of several embodiments thereof, taken in conjunction with the accompanying drawings wherein like elements are designated by identical reference numerals throughout the several views, and in which.

DETAILED DESCRIPTION

The present invention provides a method for fabricating asymmetric MOSFET devices in general, but which has particular applicability for technology nodes of 90 nm and below. The advantages of the method and the resultant asymmetric MOSFET device structures are:

1. The technical approach is feasible at 45 nm gate length and below; unlike other solutions proposed in the prior art, the present invention does not rely on photolithographically defining resist features that cover one side of the gate. This is impossible to achieve at current gate dimensions and overlay tolerances. The present invention uses an angled ion implant to selectively damage a nitride mask layer to create a one-sided spacer at current lithography and gate/pitch dimensions.

2. The asymmetric MOSFET device is self aligned, unlike other solutions proposed in the prior art which deposit the gate material after implanting the source and drain extension implants, and then lithographically attempt to align the gate to the previously implanted source/drain extensions.

3. The fabrication process allows the source side and the drain side to be independently selected and specified for each transistor, which cannot be achieved by prior art methods that use simple ion implant shading provided by the gate.

The method of forming an asymmetric extension MOSFET using a drain side spacer is described in detail below in the context of a stacked MOSFET device, having a regular stacked array of sources, gate conductors and drains, but the present invention also has general applicability to semiconductor devices other than just stacked MOSFET devices.

Figure 1:
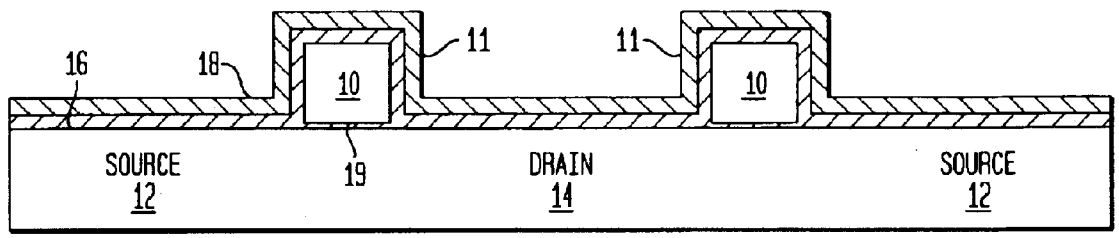
FIG. 1 illustrates a substrate on which a stacked array of gate conductors is formed, with each gate conductor separating a source region and a drain region in the stacked array.

FIG. 1 illustrates a substrate, typically formed of silicon, on which a stacked array of gate conductors 10 is formed, typically of polysilicon or other known materials, with each gate conductor having a pair of opposed sidewalls 11 separating a source region 12 and a drain region 14 in the stacked array. An oxide layer 16 is formed over the entire structure, over each source region, gate conductor and drain region, and a nitride mask layer 18 is then formed over the oxide layer and the entire structure. A gate dielectric 19 such as an oxide is also positioned between the gate conductor 10 and the substrate. The structure shown in FIG. 1 is formed using conventional processing techniques including deposition or thermal oxidation and patterning by lithography and etching.

Figure 2:
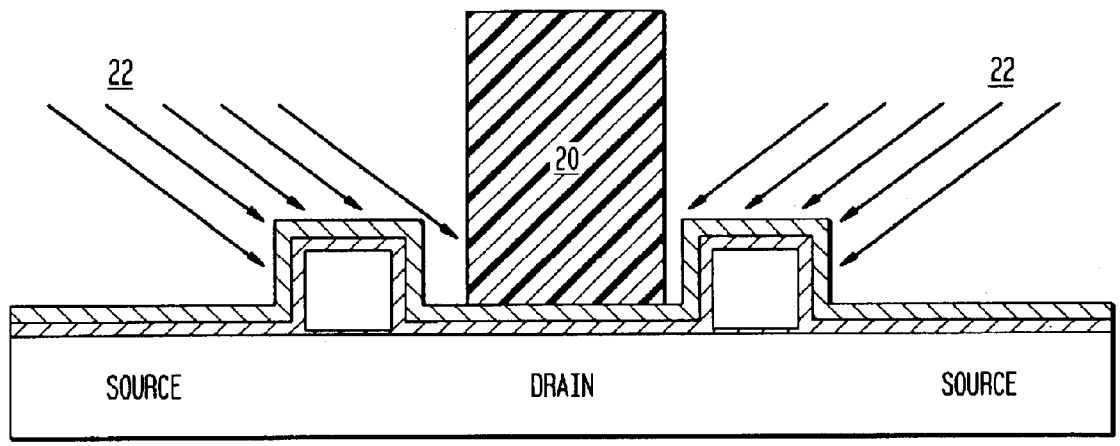
FIG. 2 illustrates a photoresist mask formed over the drain region pursuant to the present invention such that when an angled ion implant is subsequently performed, the photoresist mask and the gate structure shield the nitride mask layer over the drain region and on the sidewalls of the gate conductors from damage by the angled ion implant.

FIG. 2 illustrates a photoresist feature 20 formed over a portion of the drain region, pursuant to the present invention, such that when an angled ion implant 22 is subsequently performed as illustrated schematically in FIG. 2, the photoresist mask 20 and the gate structure 10,16,18 shield the nitride mask layer over the drain region and over the sidewalls 11 of the gate conductors from damage by the angled ion implant. The angled ion implant is used to selectively damage the unprotected (unshaded) nitride layer to subsequently fabricate a one-sided spacer, in one embodiment, at current lithography and gate pitch dimensions, such that the damaged nitride layer can be subsequently removed selectively to the oxide, as by a timed H3PO4 etch at 80 degrees C, leaving a U shaped or L shaped nitride mask to protect the drain region and sidewalls from a subsequent ion implant. An L shaped nitride mask can be formed as a portion of the U shape when the photoresist mask and gate only protect a portion of or all of the drain region and only one sidewall of a gate conductor.

Figure 3:
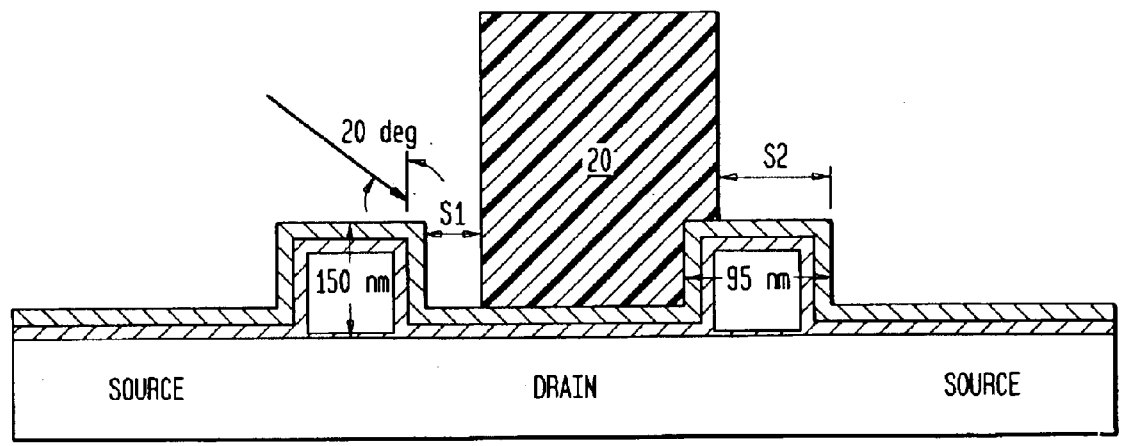
FIG. 3 illustrates a worst case situation of misalignment for the present invention for lithography having a lithography image tolerance and an overlay (displacement of photoresist) tolerance.

FIG. 3 illustrates a worst case situation of misalignment for the present invention for 193 nm lithography having a 10 nm lithography image tolerance and a 28 nm overlay (displacement of photoresist) tolerance. The coated gate conductor has typical dimensions of 150 nm by 95 nm, and the example assumes a 20 degree (from a vertical) angled ion implant, and illustrates the dimensions S1 and S2.

The lithography level for masking the chosen drain side of the device has to be a critical alignment lithography level aligning to the gate. The following is a quantitative example. For 193 nm lithography, the image tolerance is 10 nm and the overlay tolerance is 28 nm. For a gate height of 150 nm, nitride thickness of 30 nm and a nitride damaging implant done at 20 degrees, the spacing S1 should be less than 65 nm. The spacing S2 should be greater than zero and less than 95 nm. Gate lengths should be around 35 nm. In this case, the photoresist edge can be designed to be 10 nm over the gate edges on both sides, and for this lithography example all requirements for S1 and S2 are easily met.

Figure 4:
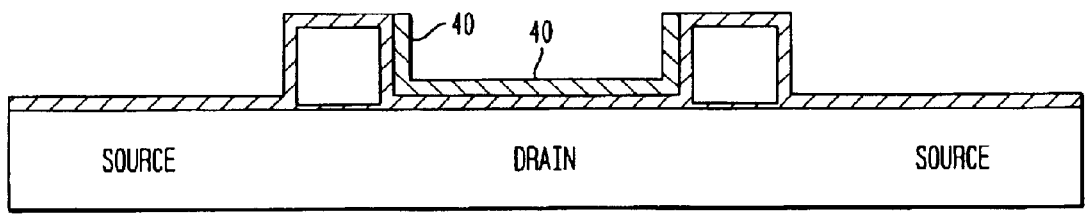
FIG. 4 illustrates a U shaped nitride mask over the drain region and two sidewalls of the two surrounding gate conductors after removal of the photoresist and of the damaged portions of the nitride mask.

FIG. 4 illustrates a U shaped nitride mask 40, over the drain region and two sidewalls of the two surrounding gate conductors on a wafer, which is formed after removal of the photoresist and of the damaged portions of the nitride mask. This nitride layer can be used as a mask for a subsequent ion implant step that would define the source doping.

Figure 5:
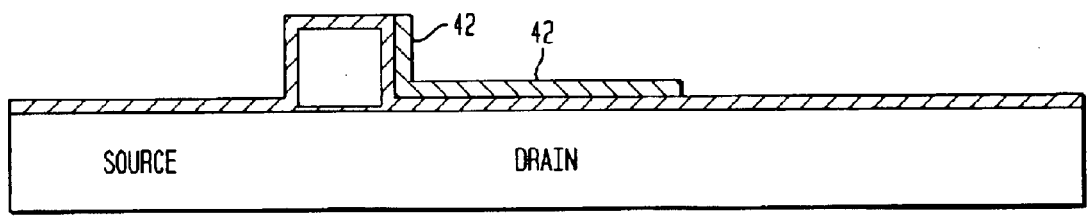
FIG. 5 illustrates an isolated device wherein an L shaped nitride mask is formed over a portion or all of the drain region and over only one sidewall of one surrounding gate conductor

FIG. 5 illustrates an isolated device, typically formed on the same wafer of FIG. 4, wherein an L shaped nitride mask 42 is formed over a portion or all of the drain region and over only one sidewall of one surrounding gate conductor. This is typically the case for non-stacked (isolated) devices.

Two separate embodiments are possible at this point in the process.

Figure 6:
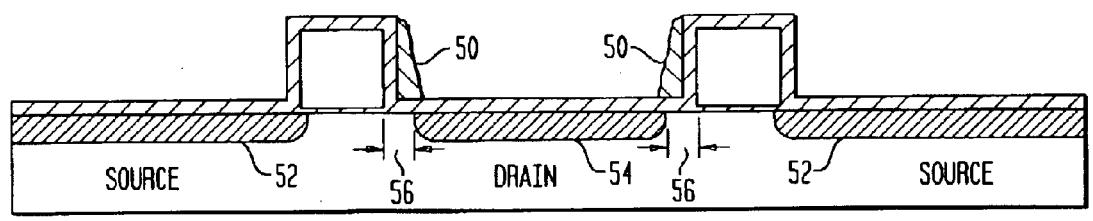
FIG. 6 illustrates a first embodiment wherein the U shaped nitride mask is subject to an RIE (reactive ion etch) to form drain side spacers on the gate conductor sidewalls, after which the entire structure is subject to a single ion implant, such that the drain side spacers provide an offset extension of the implant to form the asymmetric MOSFET.

FIG. 6 illustrates a first embodiment wherein the U shaped nitride masks (over the entire stacked device) have been subject to an RIE (reactive ion etch) to remove the horizontally exposed layer of nitride over the drain region to form drain side spacers 50 on the gate conductor sidewalls. The entire structure is then subject to a single dopant implant, forming dopant implants 52, 54 in the sources and the drains, and wherein the drain side spacers provide an offset 56 of the dopant implant 54 into the drain, whereas the dopant implant 52 into the source has no offset and is directly adjacent to the gate, to form the asymmetric MOSFET. In another embodiment, a first implant of dopant can be performed into only the source region while the drain region is protected by the undamaged portions of the nitride layer; removing the undamaged portions of the nitride layer, and performing a second implant of dopant into both the source region and the drain region, such that the source region is subject to two additive dopant implants while the drain region is subject to only the second dopant implant, to form the asymmetric extension MOSFET device.

A halo implant can be performed symmetrically before the oxide/nitride stack is deposited. In the first embodiment an asymmetric halo can be obtained by implanting the halo after the one-sided spacer is defined.

Figure 7:
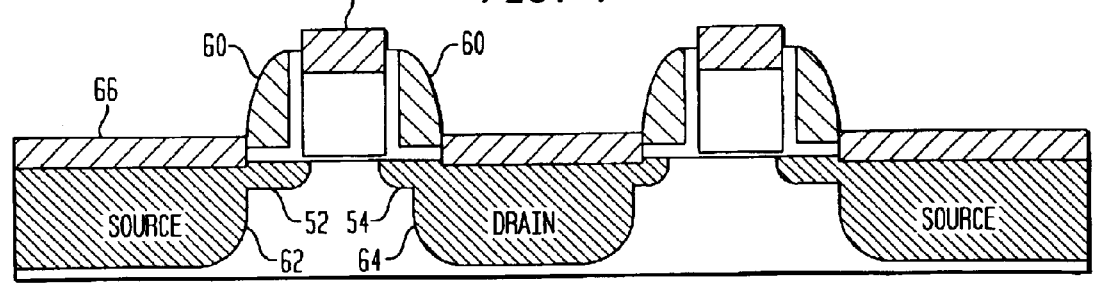
FIG. 7 illustrates a completed asymmetric MOSFET device structure for the first embodiment, wherein following art known processes, additional gate sidewalls are added, a deep source and drain implant forms deeper implanted regions in areas not protected by the gate sidewalls, with the source and drain extensions remaining under the gate sidewalls (forming the asymmetric MOSFET), followed by the formation of a silicide layer over the exposed silicon in the source and drain regions and over the gate conductors.

FIG. 7 illustrates a completed asymmetric MOSFET device structure for the first embodiment, wherein following art known processes, additional gate sidewalls 60 are added, a deep source and drain dopant implant forms deeper implanted region 62, 64 in the source and drain areas not protected by the gate sidewalls 60, with the source and drain extensions 52, 54 remaining under the gate sidewalls to form the asymmetric MOSFET, followed by the formation of a silicide layer 66 over the exposed silicon on the source and drain regions and over the gate conductor.

While several embodiments and variations of the present invention for a method of forming an asymmetric extension MOSFET using a drain side spacer are described in detail herein, it should be apparent that the disclosure and teachings of the present invention will suggest many alternative designs to those skilled in the art.

What is claimed is:

1. A method of fabricating an asymmetric extension MOSFET device using a drain side spacer comprising:

forming a semiconductor device having a substrate on which a gate conductor having sidewalls separates a source region and a drain region, and having an oxide layer formed over the gate conductor, the source region and the drain region, and a nitride layer formed over the oxide layer;

forming a photoresist mask over at least a portion of the drain region;

performing an angled ion implant during which the photoresist mask and the gate conductor shield the nitride layer over at least a portion of the drain region and on at least one sidewall of the gate conductor from damage by the angled ion implant, such that the angled ion implant selectively damages portions of the nitride layer unprotected by the photoresist mask and the gate conductor to form damaged portions of the nitride layer;

removing the damaged portions of the nitride layer while leaving the undamaged portions of the nitride layer as a nitride mask to protect at least a portion of the drain region and at least one gate sidewall from a subsequent dopant implant; and performing at least one dopant implant into the source region and the drain region while using the undamaged portions of the nitride layer as a mask to form the asymmetric extension MOSFET device.

2. The method of claim 1, wherein:

the step of using the undamaged portions of the nitride layer includes etching the undamaged portions of the nitride layer to form a drain side spacer on the gate conductor sidewall; and the step of performing at least one dopant implant includes implanting dopant into the source region and the drain region while the drain side spacer provides an offset extension of the implant to form the asymmetric extension MOSFET device.

3. The method of claim 2, wherein the step of etching uses a reactive ion etch.

4. The method of claim 2, wherein the step of performing at least one dopant implant consists of performing a single dopant implant.

5. The method of claim 1, wherein the method is performed on a stacked MOSFET device having a regular stacked array of a plurality of sources, gate conductors and drains.

6. The method of claim 1, wherein the step of removing damaged portions of the nitride layer leaves an undamaged U shaped nitride mask over the drain region and two sidewalls of two surrounding gate conductors.

7. The method of claim 1, wherein the step of removing damaged portions of the nitride layer leaves an undamaged L shaped nitride mask over a portion of the drain region and over one sidewall of the gate conductor.

8. A method of fabricating an asymmetric extension stacked MOSFET device using a drain side spacer comprising:

forming a semiconductor device having a substrate having a plurality of spaced gate conductors, with each gate conductor having two sidewalls and separating a source region and a drain region, and having an oxide layer formed over the gate conductors, the source regions and the drain regions, and a nitride layer formed over the oxide layer;

forming a photoresist mask over at least a portion of each drain region;

performing an angled ion implant during which the photoresist masks and the gate conductors shield the nitride layer over at least a portion of each drain region and at least one sidewall of each gate conductor from damage by the angled ion implant, such that the angled ion implant selectively damages portions of the nitride layer unprotected by the photoresist masks and the gate conductors to form damaged portions of the nitride layer;

removing the damaged portions of the nitride layer while leaving the undamaged portions of the nitride layer as a nitride mask to protect at least a portion of each drain region and at least one gate sidewall of each gate conductor from a subsequent dopant implant; and performing at least one dopant implant into the source regions and the drain regions while using the undamaged portions of the nitride layer as a mask to form the asymmetric extension stacked MOSFET device.

9. The method of claim 8, wherein:

the step of using the undamaged portions of the nitride layer includes etching the undamaged portions of the nitride layer to form a drain side spacer on at least one sidewall of each gate conductor; and the step of performing at least one dopant implant includes implanting dopant into the source regions and the drain regions while each drain side spacer provide an offset extension of the implant to form the asymmetric extension stacked MOSFET device.

10. The method of claim 9, wherein the step of etching uses a reactive ion etch.

11. The method of claim 9, wherein the step of performing at least one dopant implant consists of performing a single dopant implant.

12. The method of claim 8, wherein the step of removing damaged portions of the nitride layer leaves undamaged U shaped nitride masks over the drain regions and two sidewalls of each gate conductor.

13. The method of claim 8, wherein the step of removing damaged portions of the nitride layer leaves an undamaged L shaped nitride mask over a portion of each drain region and one sidewall of each gate conductor.

\* \* \* \* \*